(12) United States Patent
Stelter et al.

(10) Patent No.: US 6,249,200 B1
(45) Date of Patent: *Jun. 19, 2001

(54) COMBINATION OF MAGNETS FOR GENERATING A UNIFORM EXTERNAL MAGNETIC FIELD

(75) Inventors: Richard E. Stelter, Livermore; Ging Li Wang, Fremont, both of CA (US)

(73) Assignee: Dexter Magnetic Technologies, Inc., Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/058,268

(22) Filed: Apr. 10, 1998

(51) Int. Cl.⁷ .................................................... H01F 7/02
(52) U.S. Cl. ............................................. 335/302; 335/299
(58) Field of Search .................................. 335/296, 299, 335/300, 301–306; 346/74.2, 74.5; 360/111; 204/298, 192.2

(56) References Cited

U.S. PATENT DOCUMENTS

| | | | |
|---|---|---|---|
| 4,081,627 | * | 3/1978 | Crist .................................. 179/115.5 |
| 4,673,482 | * | 6/1987 | Setoyama et al. .................... 204/298 |
| 4,813,007 | * | 3/1989 | Tanoshima et al. ................. 346/74.5 |
| 5,026,470 | * | 6/1991 | Bonyhard et al. ............... 204/298.16 |
| 5,630,916 | * | 5/1997 | Gerrish et al. ..................... 204/192.2 |

OTHER PUBLICATIONS

PCT International Search Report for PCT/US99/07757, mailed Aug. 12, 1999.

* cited by examiner

*Primary Examiner*—Lincoln Donovan
(74) *Attorney, Agent, or Firm*—Blakely Sokoloff Taylor & Zafman, LLP

(57) ABSTRACT

A combination of magnets provides a substantially uniform external magnetic field, in which a plate shaped magnet generates an external magnetic field and a frame shaped magnet generates another external magnetic field. The frame and plate shaped magnets are disposed proximate each other to provide, through the combination of their external magnetic fields, the substantially uniform external magnetic field in a plane disposed substantially parallel to the plate and frame shaped magnets. The size, shape and relative position of the magnets combine to produce an external magnetic field having a highly uniform magnetic field orientation over a wider area of a plane disposed proximate the magnets than heretofore available.

8 Claims, 12 Drawing Sheets

COMBINATION OF MAGNETS FOR GENERATING A UNIFORM EXTERNAL MAGNETIC FIELD

BACKGROUND OF THE INVENTION

1. Field of the Invention

The present invention relates to the field of magnets. In particular, the present invention relates to a combination of magnets, either electromagnets or permanent magnets, for generating a very uniform external magnetic field in a plane disposed proximate to the combination of magnets.

2. Description of the Related Art

Magnets, both permanent magnets and electromagnets, are used in applications that exploit the magnets' unique capability to provide a force, or perform work of some kind, while avoiding contact with the object on which the force is exerted, or work performed. A magnetic structure performs work through the generation of a magnetic field external to itself. Typically, the object upon which the magnet operates is disposed proximate the magnet such that the external magnetic field generated by the magnet produces a desired effect on the object. The greater the strength of the magnetic field generated by the magnet, the greater the magnet's ability to perform work. To that end, research has focused on techniques for improving the efficiency of the magnetic circuit formed by a magnet, whether permanent magnet or electromagnet, to maximize the strength of the external magnetic field generated by the magnets while minimizing the volume of magnetic material (in a permanent magnet) or the size of the core/coils (in an electromagnet).

Additionally, in certain applications, such as ion beam deposition, wherein atoms are stripped from a magnetic target for depositing on a substrate, magnets are used to improve the deposition process, for example, by increasing target utilization/yield and deposition rate. In such applications, not only is increasing the flux density, B, of the external magnetic field generated by the magnets important, but so is controlling the direction and uniformity of the flux lines within the external magnetic field. Likewise, controlling uniformity in flux density in the external magnetic field is important. Thus, the prior art focuses on controlling these aspects of the external magnetic field generated by a permanent magnet structure or electromagnet to, for example, increase substrate yield and minimize magnet size and equipment cost.

U.S. Pat. No. 5,630,916, issued to Gerrish et al. discuss the art of manufacturing magnetic recording heads, in which thin films of magnetic material having a particular magnetic field orientation are deposited by a sputtering apparatus on a substrate. The process involves the placement of a magnet near the substrate to expose the substrate to a magnetic field having uniform magnitude field lines extending in a uniform direction, that is, a uniform magnetic field, thereby causing the magnetic material to be deposited on the substrate in a predetermined magnetic orientation. In this manner, the magnetic domains in the magnetic film being formed on the surface of the substrate can be oriented in the same direction. However, Gerrish et al. point out that, in the prior art, only a small portion of the magnetic field generated by the magnet has the necessary uniformity, thus limiting the area of the substrate over which the target material is deposited in the desired magnetic orientation. Yet commercial demand calls for the use of a larger substrate, coated with a magnetic film having more accurately aligned magnetic orientation, over a larger portion of the substrate, to improve substrate yield.

FIG. 1 illustrates a prior art dipole permanent magnet plate 100 made of, for example, annealed low carbon steel, or Alnico. A magnetized state in plate 100 provides for a north pole 108 along one edge 107 and a south pole 110 along an opposing edge 109 such that an external magnetic field is generated by leakage flux over the surfaces of the plate between the north and south pole. The magnetic lines of force, i.e., the flux lines, are illustrated with respect to coordinates x, y and z. The flux lines all flow from the north pole to south pole, and thus repel one another, so that the flux lines tend to diverge as they move away from a pole, rather than converge or remain parallel. The flux lines, then, tend to follow parallel paths 104 along a central axis 101 in the direction of the coordinate x, but progressively diverge in the direction of the coordinate y as one moves along the plate from the central axis 101 to the edges 103 or 105 orthogonal to the north and south poles at edges 107 and 109 respectively. The uniformity of the magnetic field in the x coordinate direction in a substantially parallel plane above or below the plate varies, then, from being substantially uniform over the center of the plate and along the center axis, to being less so as one moves along the plane in the y coordinate direction. That is, the uniformity in the direction of the lines of flux, as well as the uniformity of flux density, in a substantially parallel plane above or below the plate decreases as one moves from the center of the plate, particularly along the plane in the y coordinate direction. This is best illustrated with reference to FIG. 3, which provides a top view of a prior art plate 300. Flux lines at or near 304 in the center of the plate flow substantially in the x coordinate direction, from north pole 308 to south pole 310, while flux lines 302 at or near the edges of the plate include a significant y coordinate component to their direction.

FIG. 2 illustrates a plate-shaped electromagnet 200, having a core made of, for example, cold rolled steel. The core is wrapped in a coil of electrically conductive wire 212 that is connected to a power supply (not shown). When power is supplied by the power supply to the coil, electrical current flowing through the coil induces a magnetic field normal to the direction of electrical current flow, identical to the magnetic field generated by the dipole permanent magnet plate 100 in FIG. 1. Thus, the electromagnet of FIG. 2, just as the permanent magnet of FIG. 1, provides for a north pole 208 along one edge 207 and a south pole 210 along an opposing edge 209 such that an external magnetic field is generated by magnetic flux lines passing over the surfaces of the plate between the north and south pole. The flux lines progressively diverge in the direction of the coordinate y as one moves along the plate shaped electromagnet from the central axis 201 to the edges 203 or 205 orthogonal to the north and south poles. The uniformity in the direction of the lines of flux, in a substantially parallel plane above or below the plate decreases as one moves from the center of the plate, particularly along the plane in the y coordinate direction.

The size of an object disposed in the parallel plane proximate the plates of FIG. 1 or 2 and over which it is desired to induce a substantially uniform magnetic field is, therefore, restricted to an area somewhat less than that defined by the plates. What is needed is an arrangement or combination of magnets that expands the area of substantial uniformity of the magnetic field in the plane proximate the plate such that the object disposed in the plane, e.g., a wafer, is not so restricted in size relative to the size of the plate.

Gerrish et al. disclose obtaining a substantially uniform magnetic field in a plane proximate a plate shaped electromagnet by varying either the density of the windings or the amount of current flowing in the windings wrapped around the electromagnetic plate, so that increased electrical current flows through the windings near the ends of the plate-shaped core to compensate for changes in the strength of the magnetic field at or near the ends. This approach, however, is limited to electromagnetic arrangements, and may require variable and/or multiple power supplies. What is needed is a magnet arrangement for providing a desired uniform external magnetic field that may incorporate permanent and/or electromagnets, and which does not require multiple, sophisticated, and expensive power supplies.

Additionally, the Gerrish et al. approach produces uniform direction of the magnetic field in the area of a plane proximate the electromagnetic plate having a skew of at least ±one degree or more from the so-called "easy" axis. However, present applications for such magnet arrangements require an angular dispersion of not more than ±0.5 degrees from the desired direction of the flux lines comprising the external magnetic field.

The prior art use of magnetically permeable field shapers positioned next to the plate shaped magnet provide for an increase in the size of the area in the plane proximate to the plate shaped magnet over which a substantially uniform magnetic field may be achieved. However, such arrangements still fail to provide angular dispersion of not more than ±0.5 degrees from the desired direction of the flux lines comprising the external magnetic field.

Thus, what is needed is a novel arrangement of magnets that generates an external magnetic field having a highly uniform magnetic field orientation over a wider area of a plane disposed proximate to the arrangement of magnets than heretofore provided by prior art arrangements.

BRIEF SUMMARY OF THE INVENTION

A combination of magnets that provides a substantially uniform external magnetic field is described, in which a plate shaped magnet that generates an external magnetic field and a frame shaped magnet that generates another external magnetic field are disposed proximate each other to provide the substantially uniform external magnetic field in a plane disposed substantially parallel to the plate and frame shaped magnets by the superposition of their external magnetic fields. The size, shape and relative position of the magnets combine to produce an external magnetic field having a highly uniform magnetic field orientation over a wider area of a plane disposed proximate the magnets.

BRIEF DESCRIPTION OF THE SEVERAL VIEWS OF THE DRAWINGS

The embodiments of the present invention are illustrated by way of example and not limitation in the accompanying figures, in which.

DETAILED DESCRIPTION OF THE INVENTION

The present invention relates to a combination of magnets that provides a substantially uniform external magnetic field, in which a plate shaped magnet that generates an external magnetic field and a frame shaped magnet that generates another external magnetic field are disposed proximate each other such that the combination of their external magnetic fields provides the substantially uniform external magnetic field in a plane disposed substantially parallel to the plate and frame shaped magnets. In the following description, numerous specific details are set forth in order that a thorough understanding of the present invention is provided. It will be apparent, however, to one of ordinary skill in the art that the present invention may be practiced without these specific details. In other instances, well-known structures, materials, and techniques have not been shown in order not to unnecessarily obscure the present invention.

Figure 1:
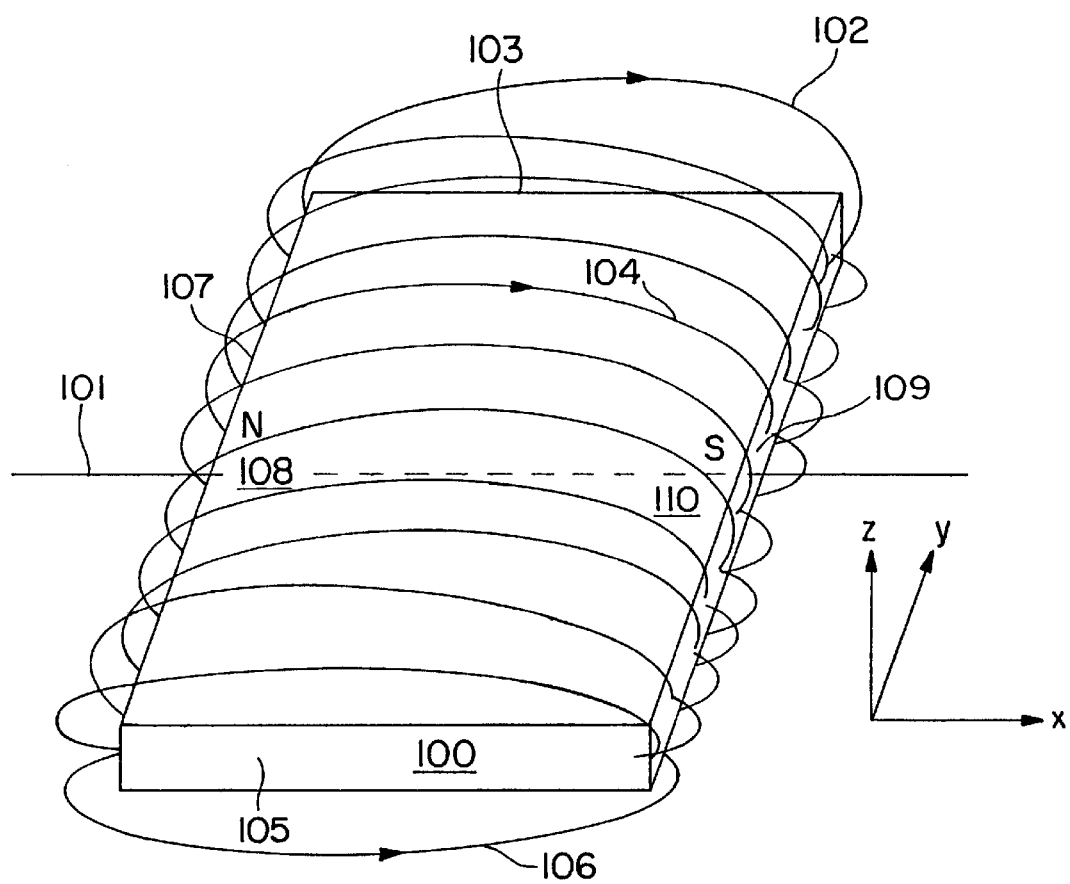
FIG. 1 illustrates a prior art permanent magnet.
Figure 2:
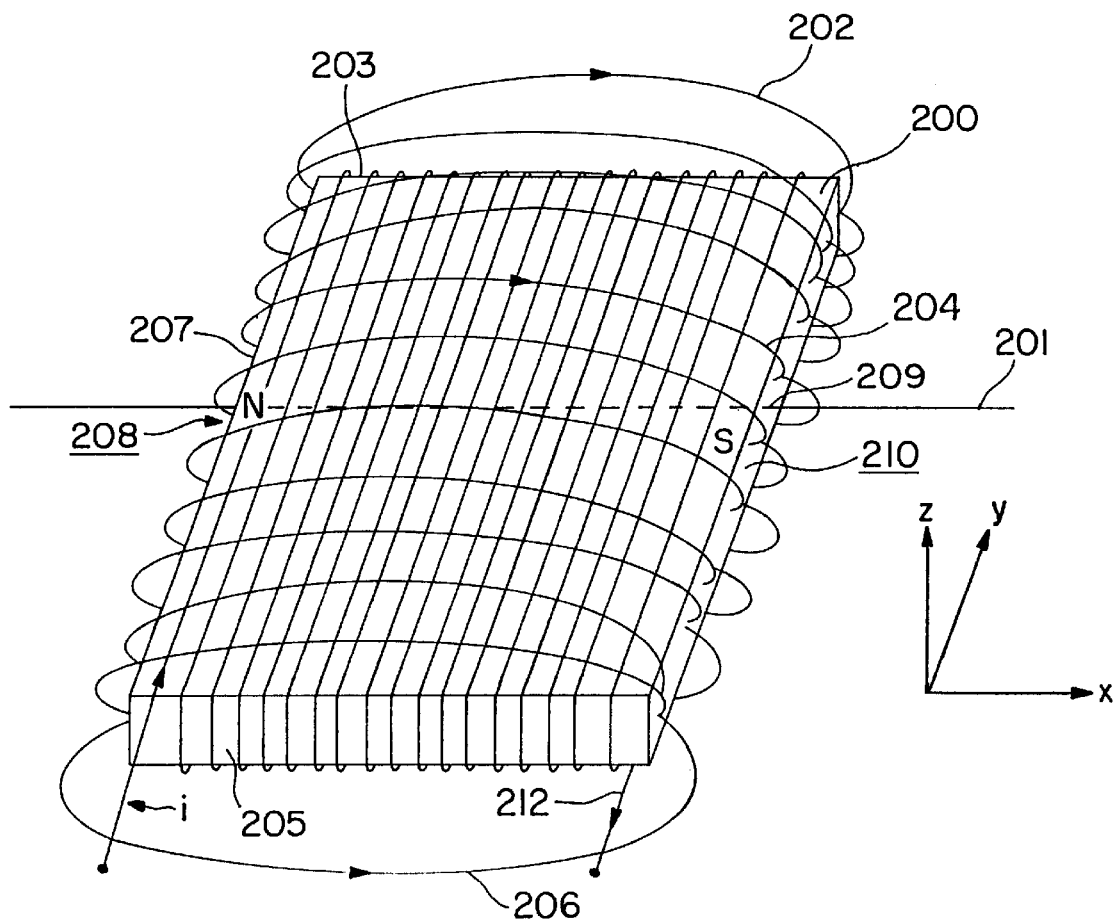
FIG. 2 illustrates a prior art electromagnet.
Figure 3:
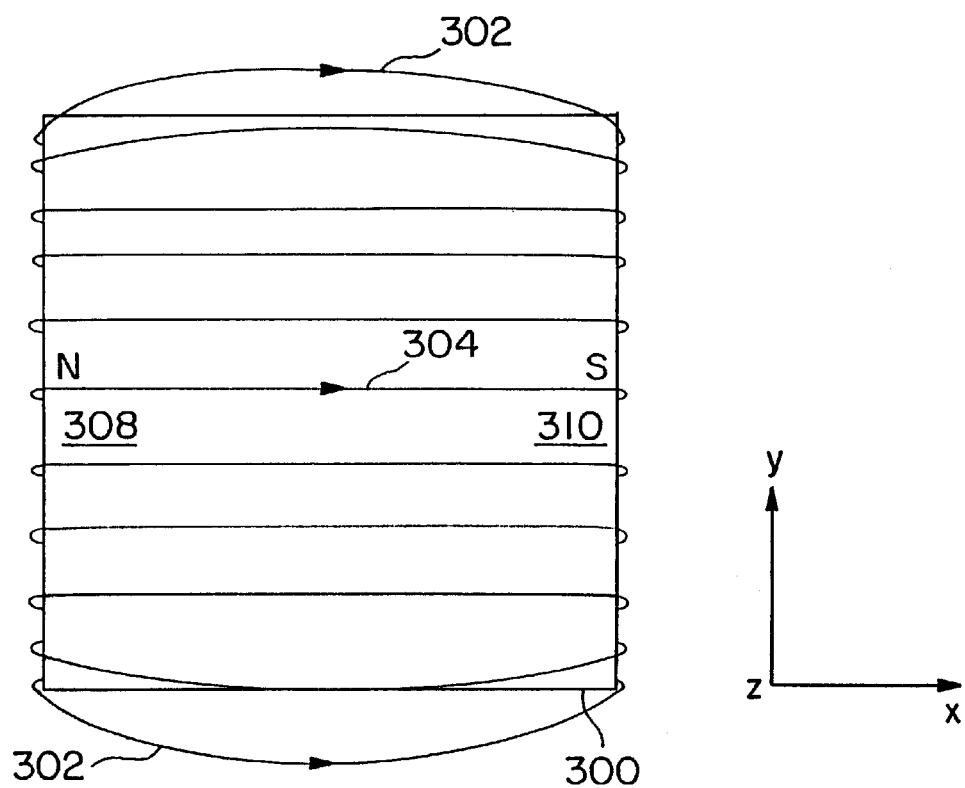
FIG. 3 represents a top view of the prior art magnets illustrated in FIGS. 1 and 2.
Figure 4A:
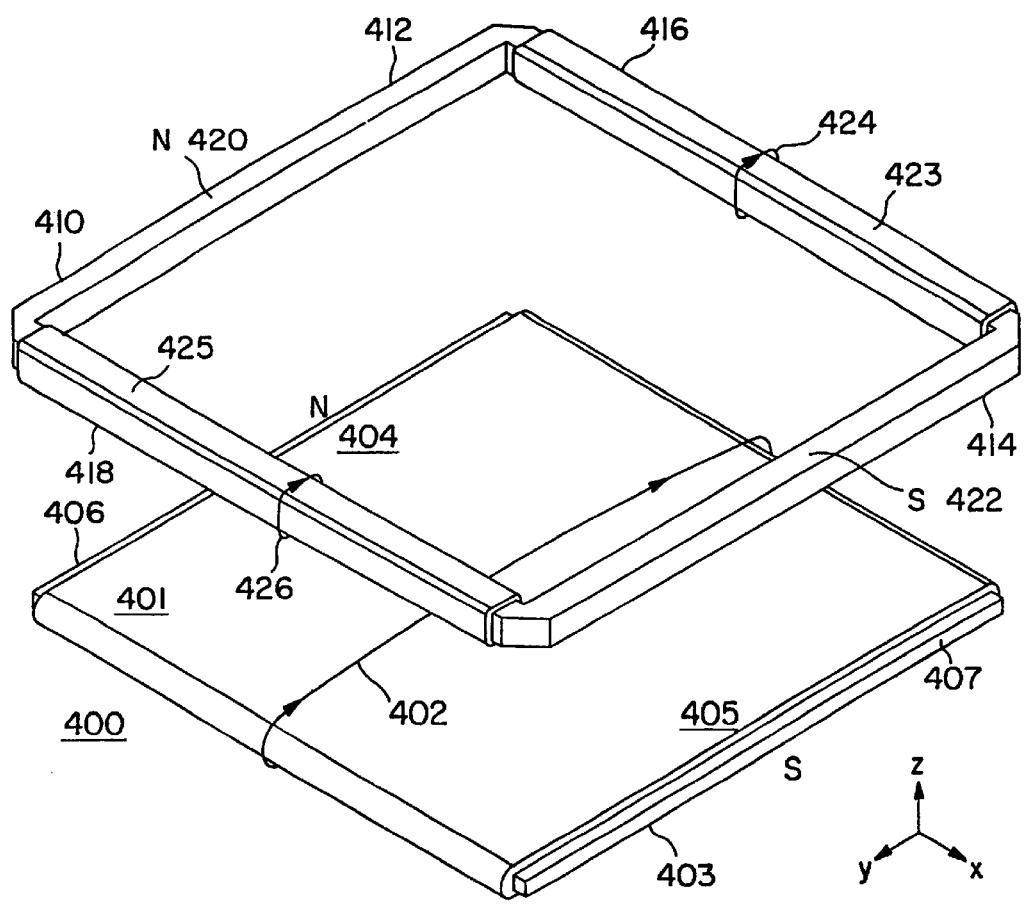
FIG. 4A illustrates an embodiment of the present invention.

With reference to FIG. 4A, an embodiment 400 of the present invention will now be described. The embodiment comprises a plate shaped magnet 401 and a frame shaped magnet 408. The plate and frame shaped magnets are situated in separate, substantially parallel, planes defined by coordinates x and y. The outer dimensions of the two magnets are substantially similar, with the frame shaped magnet centered next to or above the plate shaped magnet as illustrated. The plate shaped magnet comprises a core 407 made of a ferromagnetic material, e.g., cold rolled steel, wrapped with an electrically conductive material (shown as conductor 401 wrapped around core 407), e.g., copper wire windings, to form a current-carrying solenoid. A power supply (not shown) energizes the solenoid, causing electrical current to flow through the conductor 401 in direction 402 (i.e., the direction of the y coordinate).

Figure 5:
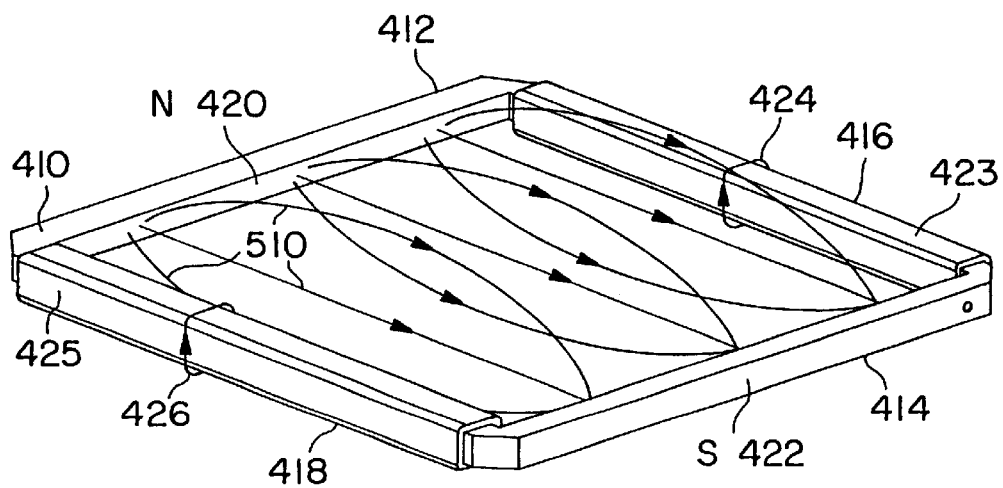
FIG. 5 illustrates the flux lines generated by the separate magnets in an embodiment of the present invention to provide the uniform external magnetic field.
Figure 5:
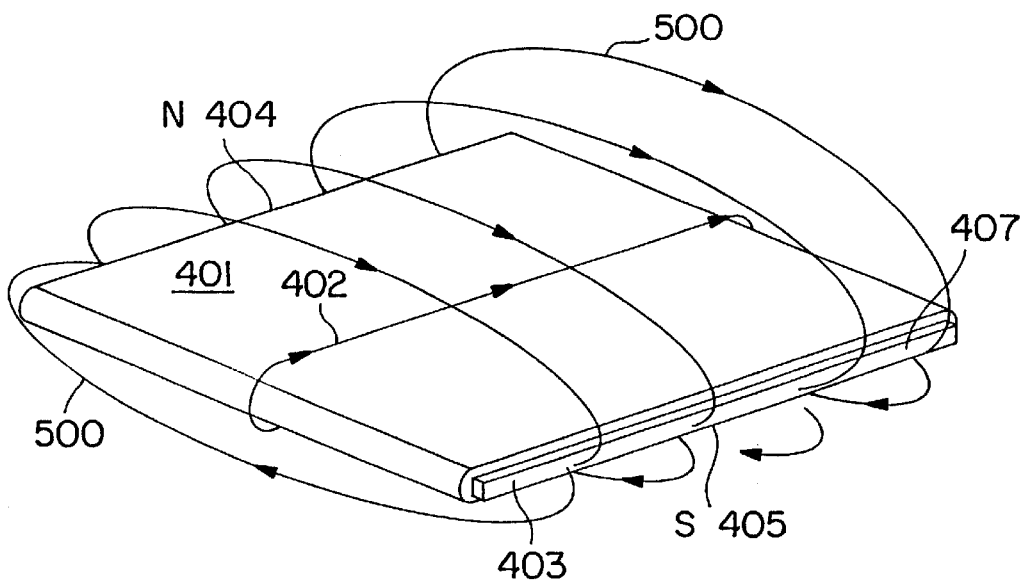

With reference as well to FIG. 5, given the direction 402 of the current flow through conductor 401, magnetic lines of force, i.e., magnetic flux 500, is generated around the windings in a direction orthogonal, i.e., at a right angle, to the direction 402 of the current flow. That is, current flowing through windings 401 in the direction of the y coordinate generates magnetic flux 500 around the plate shaped solenoid in the direction of the x coordinate. Because a solenoid can be thought of as an electromagnet, the end of the solenoid 406 where the direction of the magnetic lines of force 500 is away from the coil 401 can be thought of as the north pole 404. Likewise, the end of the solenoid 403 where the direction of the magnetic lines of force 500 is toward the coil can be thought of as the south pole 405. Thus, when energized, the plate shaped electromagnet produces a dipole magnetic field.

The frame shaped magnet disposed in the plane substantially parallel to and proximate the plate shaped electromagnet comprises four segments referenced as 412, 414, 416 and 418. Opposing segments 416 and 418 of the frame shaped magnet comprise a core made of ferromagnetic material, e.g., cold rolled steel, wrapped with an electrically conductive material, e.g., conductors 423 and 425, respectively, to form separate current carrying solenoids. One or more power supplies (not shown) energizes the solenoids, causing current to flow through the conductors 423 and 425 in directions 424 and 425 as illustrated. Segments 412 and 414, orthogonal to segments 416 and 418, are pole pieces made of magnetically permeable material, for example, low carbon steel, cold rolled steel, or Hiperco 50.

The solenoid segments 416 and 418, when energized, generate magnetic flux 510 within and external to the frame shaped magnet. The direction of the magnetic flux 510 is orthogonal to the direction of current flow through conductors 423 and 425, i.e., the direction of magnetic flux 510 respectively generated by segments 416 and 418 is along the length of segments 416 and 418. Segment 412, being placed at the end of the solenoids where the direction of the magnetic lines of force 510 is away from the coils, can be thought of as the north pole 420 of the frame, whereas segment 414, being placed at the end of the solenoids where the direction of the magnetic flux 510 is toward the coils, can be thought of as the south pole 422. Thus the north and south poles of the frame shaped electromagnet and plate shaped electromagnet are aligned with respect to each other.

When energized, the frame shaped electromagnet generates a dipole magnetic field 510 having the same relative direction and orientation as that generated by the plate shaped electromagnet. When both the frame shaped electromagnet and the plate shaped electromagnet are energized at the same time, the external magnetic fields generated by each (fields 500 and 510) combine to form a highly uniform, unidirectional, external magnetic field over an area of a plane disposed proximate and substantially parallel to the plane in which the frame shaped electromagnet is disposed. With reference to FIG. 4E, a volume 460 is depicted in which the highly uniform external magnetic field may exist.

Figure 8:
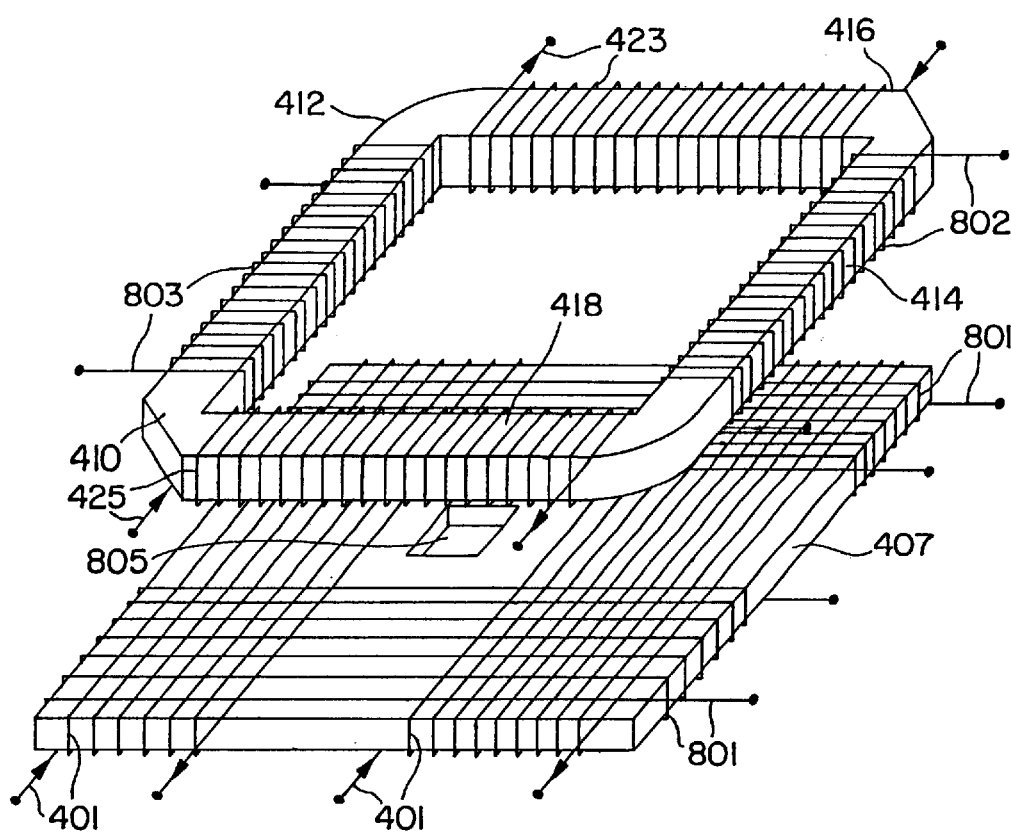
FIG. 8 illustrates an alternative embodiment of the present invention.

FIG. 8 illustrates another embodiment of the frame and plate shaped electromagnets, in which conductors are wrapped around the ferromagnetic cores in the same manner as described above with reference to FIG. 4A. Addtionally, a conductor 801 is wrapped around plate shaped core 407 in an orthogonal direction relative to conductor 401. Likewise, conductors 802 and 803 are wrapped around the opposing pair of segments 414 and 412, orthogonal to conductors 423 and 425 wrapped around corresponding segments 416 and 418. Power supplies (not shown) energize the resulting solenoids, causing electrical current to flow through the conductors 801 and produce an external magnetic field normal to the direction of the current flow through the windings. The power supplies may be the same power supplies utilized to power the orthogonally located solenoids as well, with switches set up to power one set of solenoids or the other, but not both at the same time. In this manner, the magnets can provide a uniform magnetic field in two directions: a first direction, and a second direction normal to the first direction. This is useful so that, rather than rotate an object on which the uniform external magnetic field generated by the magnets is applied, one need simply switch off the solenoids providing the magnetic field in the first direction and switch on the solenoids providing the magnetic field in the second direction. Alternatively, different power supplies may regulate the application of energy to the solenoids.

It should be pointed out that the hole 805 illustrated in the plate shaped electromagnet 407 is to accommodate the attachment of hardware and other apparatus unrelated to, and without affecting, the generation of the magnetic field by the plate shaped electromagnet as contemplated by any of the embodiments of the present invention. Indeed, the term plate as used herein contemplates a flat material having a front and back surface and that may or may not have a center or other hole in the plate as necessary for a particular application utilizing an embodiment of the present invention.

Figure 4B:
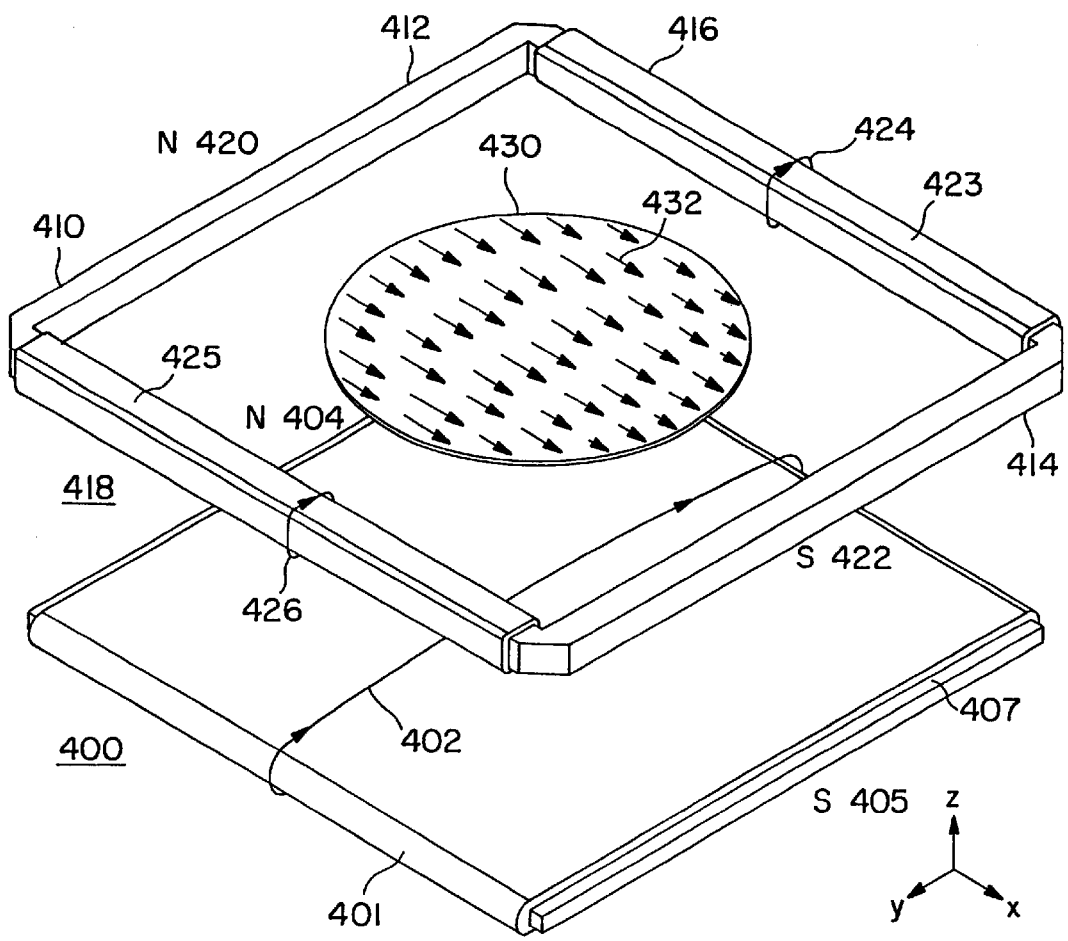
FIG. 4B illustrates the uniform direction of flux lines in the external magnetic field generated by an embodiment of the present invention.
Figure 4C:
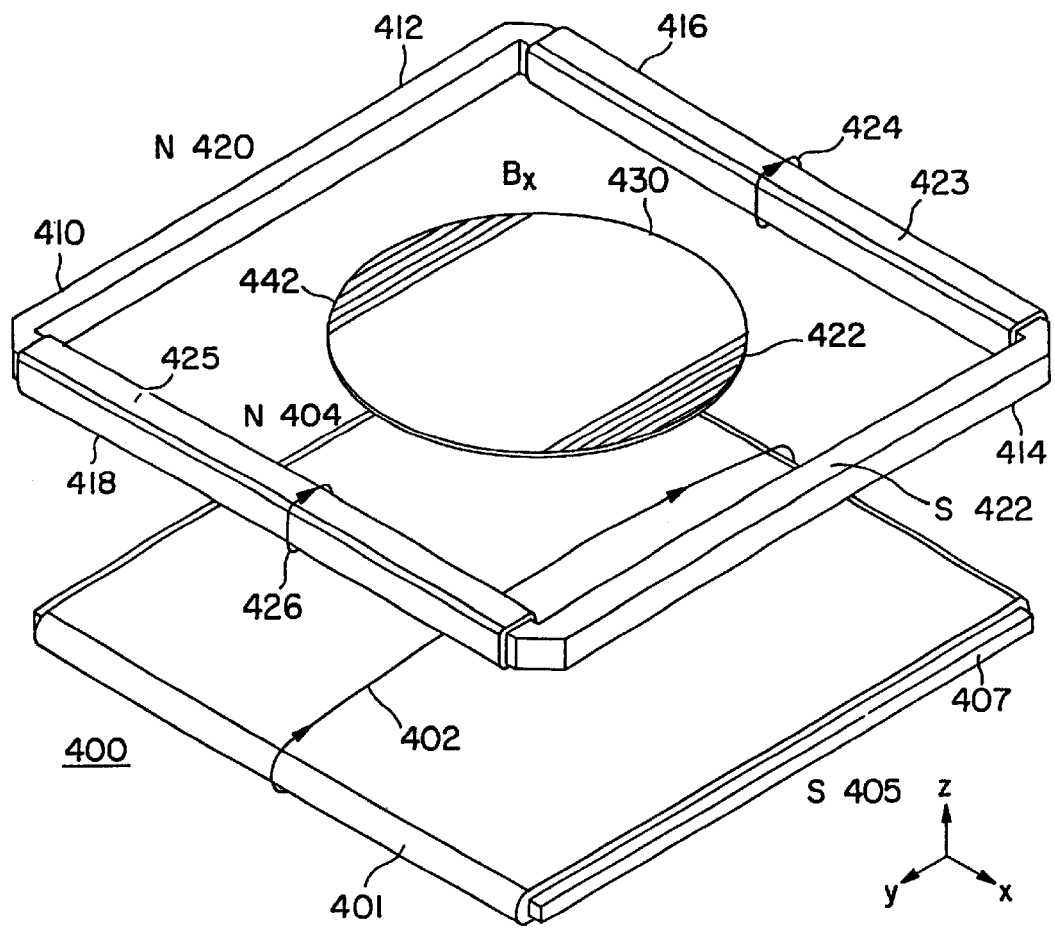
FIG. 4C illustrates the substantial uniformity of the magnetic field vector in a plane disposed proximate an embodiment of the present invention.

FIG. 4B illustrates the placement of an object 430 (e.g., a substrate or wafer as may be utilized in a deposition process) in the area of a plane disposed proximate and substantially parallel to the plane in which the frame shaped electromagnet is disposed. Arrows 432 on the surface of object 430 indicate the uniformity of the external magnet field orientation and direction across the entire surface of the object. In particular, the direction and orientation (in the x coordinate direction) of the external magnetic field surrounding the object is controlled by the shape, size composition, and arrangement of the frame and plate shaped electromagnets. With reference to FIG. 4C, gradient lines 442 illustrate the change in the magnitude of the external magnetic field, i.e., the change in magnetic flux density along the desired direction of the external magnetic field. As can be seen, the magnetic flux density is uniform at approximately 44 Gauss throughout a substantial portion of the object, and diminishes, as illustrated by gradient lines 422, by approximately twenty five percent (25%) to approximately 33.3 Gauss near the edges of the object. The frame shaped electromagnet contributes primarily to the magnetic field strength at the ends of the object, while the plate shaped electromagnet contributes primarily to the magnetic field strength over the center of the object.

Figure 4D:
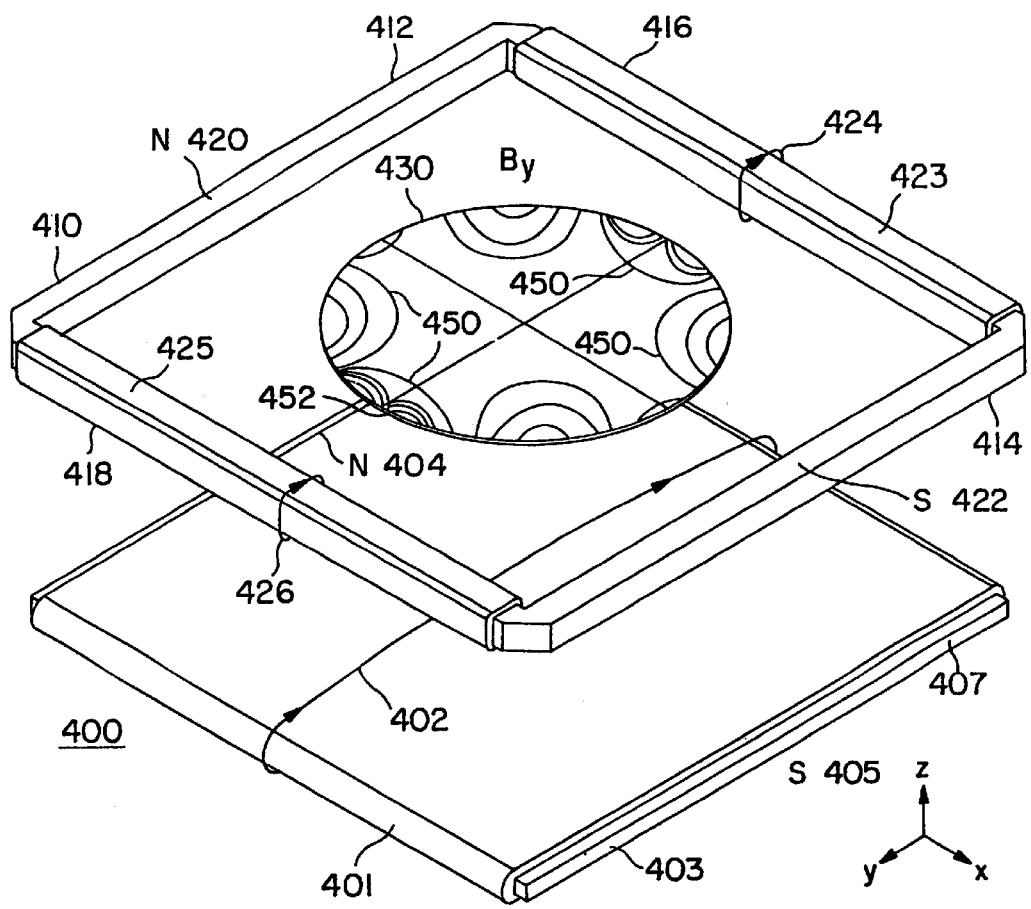
FIG. 4D illustrates a component of the flux lines in the external magnetic field generated by an embodiment of the present invention.
Figure 4E:
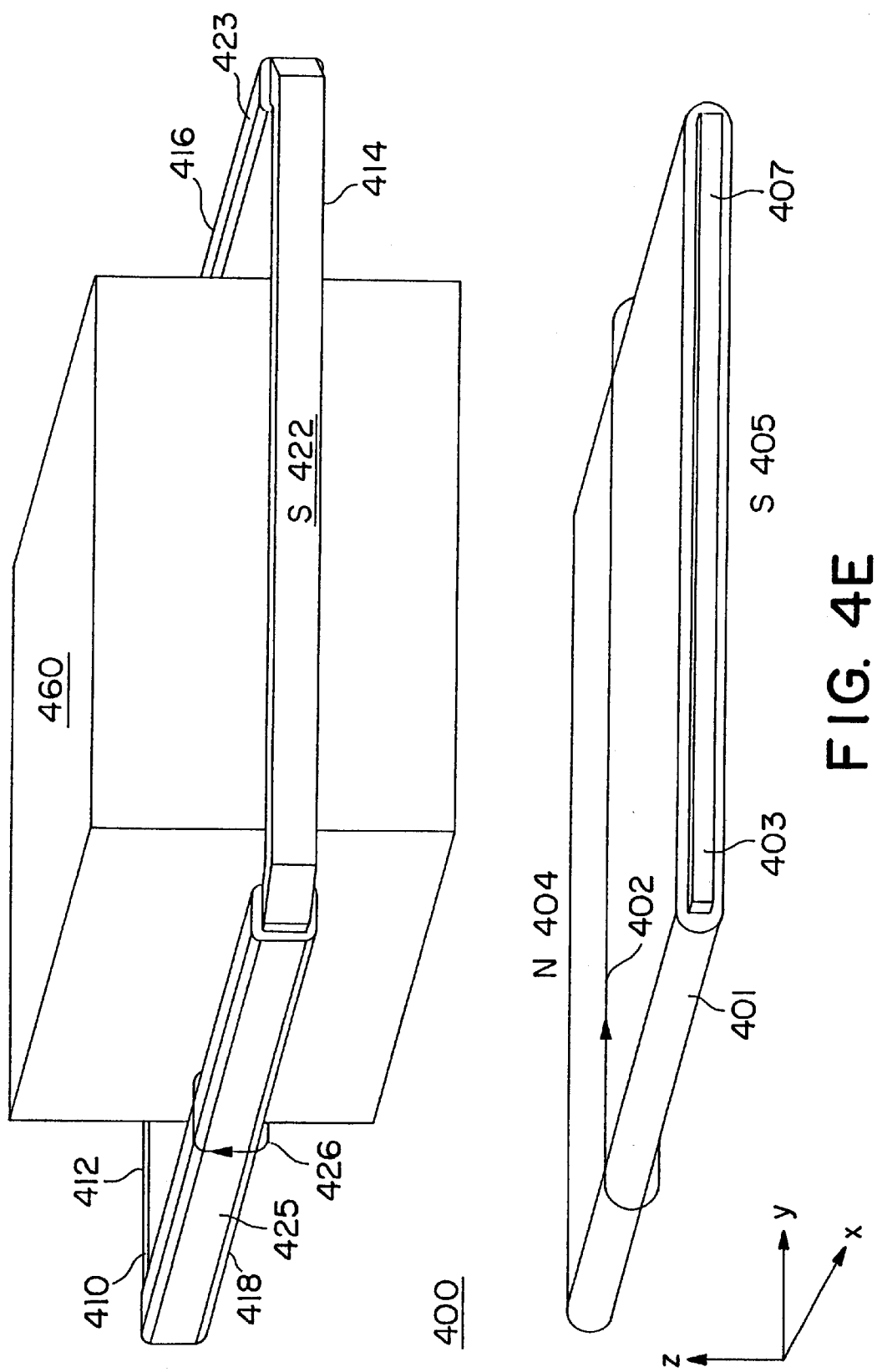
FIG. 4E illustrates a volume within an embodiment of the present invention in which the uniform direction of flux lines in the external magnetic field generated by an embodiment of the present invention is provided.

FIG. 4D illustrates the magnetic flux density 450 of the external magnetic field as measured in the y coordinate direction in the area of the plane disposed proximate and substantially parallel to the plane in which the frame shaped electromagnet is disposed, and in which object 430 is placed to perform work thereon. As can be seen, a flux density range of 0.1 to 0.4 Gauss is at least two orders of magnitude less than the flux density range of 33.3 to 44 in the x coordinate direction across the surface of the object.

Figure 6:
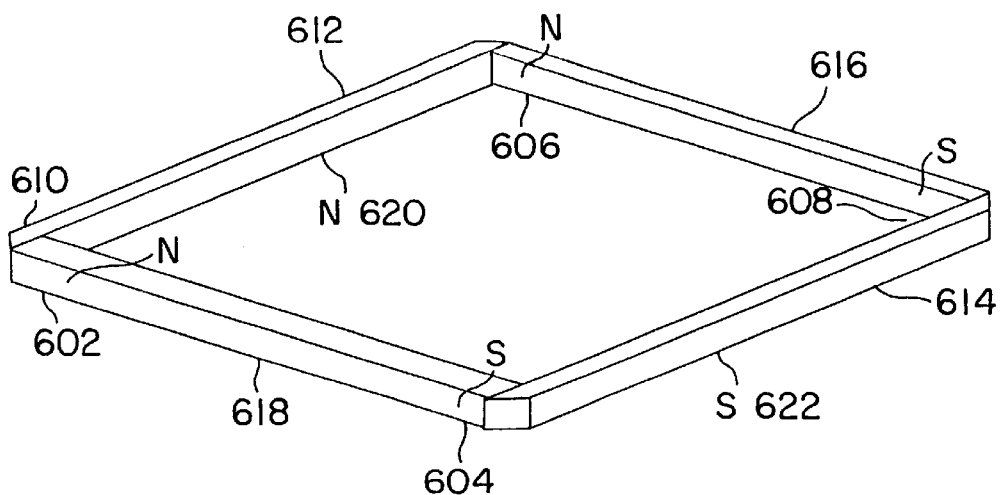
FIG. 6 illustrates an alternative embodiment of the present invention.
Figure 6:
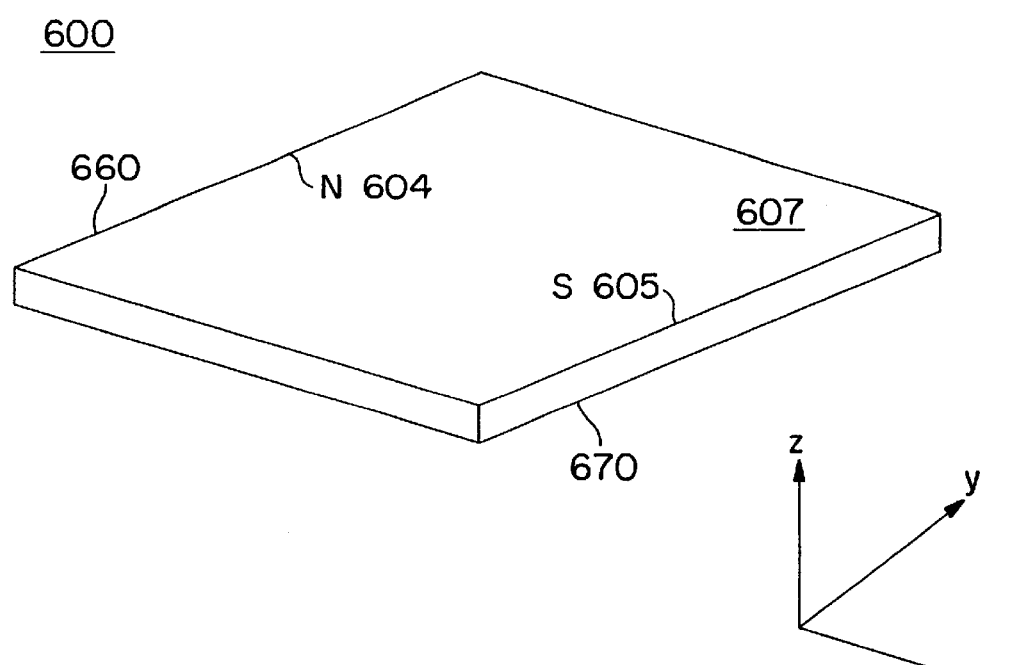
Figure 7:
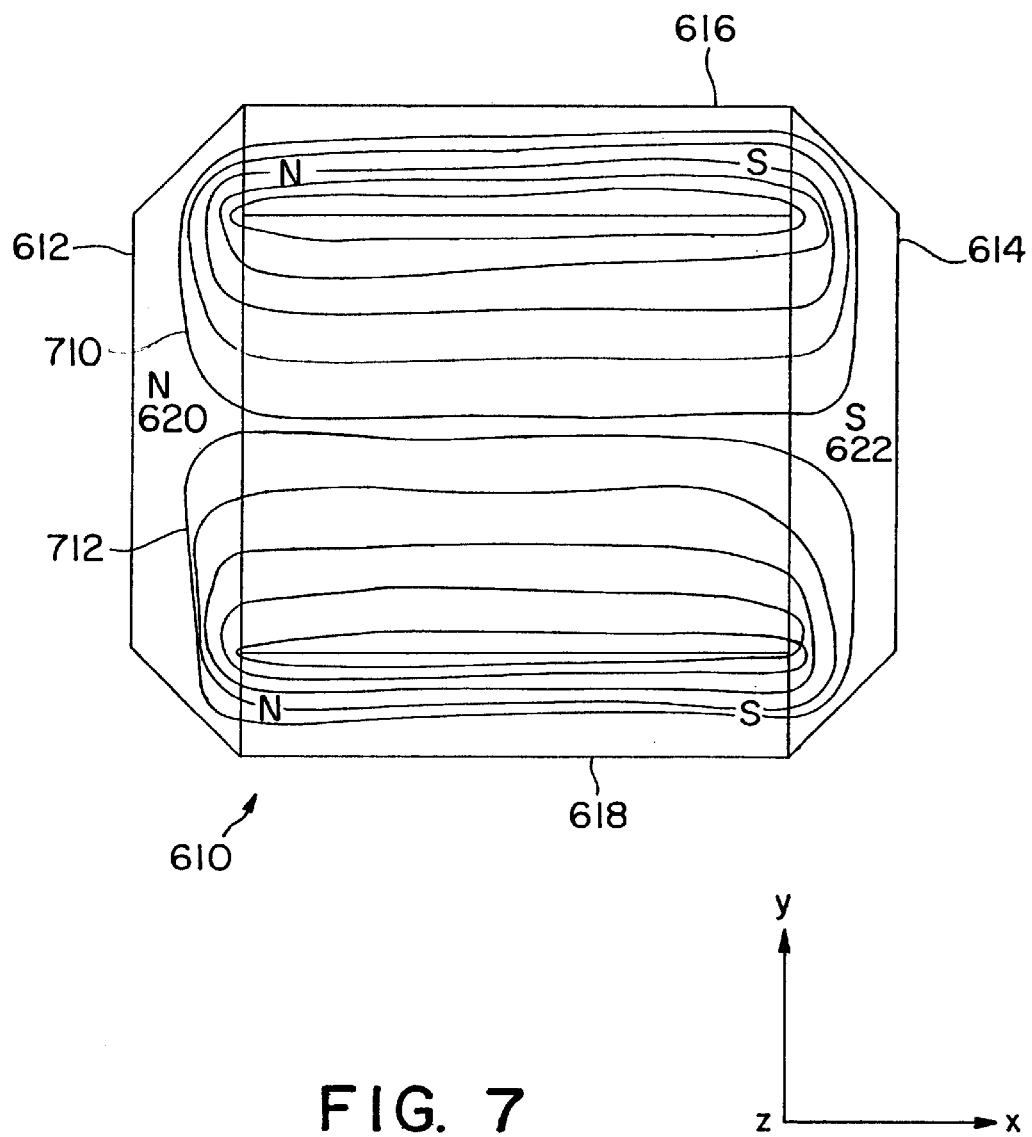
FIG. 7 illustrates the relevant flux lines generated by a component of the alternative embodiment of the present invention illustrated in FIG. 6.

With reference to FIG. 6, an alternative embodiment 600 of the present invention will now be described. The embodiment comprises a plate shaped magnet 607 and a frame shaped magnet 610. The plate and frame shaped magnets are situated in separate, substantially parallel, planes defined by coordinates x and y. The outer dimensions of the two magnets are substantially similar, with the frame shaped magnet centered next to or above the plate shaped magnet, with respect to coordinate z, as illustrated. The plate shaped magnet is made of a ferromagnetic material, e.g., Alnico. The magnetic domain of the plate shaped magnet is set up so that the north pole 604 is along edge 660 of the magnet, and the south pole along edge 670 of the magnet. In this manner, plate shaped magnet 607 produces a dipole magnetic field, similar to field 500 as described above with reference to the plate shaped electromagnet.

The frame shaped magnet 610 disposed in the plane substantially parallel to and proximate the plate shaped magnet 607 comprises four segments referenced as 612, 614, 616 and 618. Opposing segments 616 and 618 of the frame shaped magnet comprise permanent magnets made of ferromagnetic material, e.g., Alnico. Segments 612 and 614, orthogonal to segments 616 and 618, are permeable pole pieces made of magnetically permeable material, for example, low carbon steel, cold rolled steel, or Hiperco 50.

With reference to FIG. 6, the permanent magnet segments 616 and 618 are oriented to generate flux lines 710 and 712, respectively, within and external to the frame shaped magnet. Segment 612, a permeable pole piece, operates as the north pole 620 of the frame, whereas segment 614, also a permeable pole piece, operates as the south pole 622. Thus the north and south poles of the frame shaped magnet 610 and plate shaped magnet 607 are aligned with respect to each other.

The frame shaped magnet generates a dipole magnetic field, similar to field 510 discussed above in connection with the frame shaped electromagnet embodiment, and having the same relative direction and orientation as that generated by the plate shaped magnet. The external magnetic fields generated by the frame and plate shaped magnets combine to form a highly uniform, unidirectional, external magnetic field over an area of a plane disposed proximate and substantially parallel to the plane in which the frame shaped magnet is disposed, just as described above with reference to FIG. 4E in the electromagnet embodiment of the present invention.

There are, of course, many possible alternatives to the described embodiments that are within the understanding of one of ordinary skill in the relevant art. The present invention is limited, therefore, only by the claims presented below.

What is claimed is:

1. A combination of magnets that provides a uniform external magnetic field, comprising:
   a plate shaped magnet that generates a first external magnetic field;
   a frame shaped magnet that generates a second external magnetic field having a direction parallel to and in the same direction as that generated by the first external magnetic field, the frame shaped magnet disposed in a plane parallel to the plate shaped magnet such that the first and second external magnetic fields combine to provide the substantially uniform external magnetic field in a parallel plane disposed between the plate and frame shaped magnets, the substantially uniform external magnetic field having an area within the frame shaped magnet and a surface of the plate shaped magnet proximate the frame shaped magnet.

2. The combination of magnets of claim 1, wherein the frame shaped magnet comprises a frame shaped electromagnet.

3. The combination of magnets of claim 2, wherein the plate shaped magnet comprises a plate shaped permanent magnet.

4. The combination of magnets of claim 2, wherein the plate shaped magnet comprises a plate shaped electromagnet.

5. The combination of magnets of claim 2, wherein the frame shaped electromagnet comprises electrically conductive windings wrapped in a parallel manner around opposing sides of the frame shaped electromagnet.

6. The combination of magnets of claim 4, wherein the plate shaped electromagnet comprises electrically conductive windings wrapped in a parallel manner around the plate shaped electromagnet.

7. A combination of permanent magnets, comprising:
   a plate shaped permanent magnet that generates a first external magnetic field, the plate shaped permanent magnet having a north magnetic pole at one end and a south magnetic pole at an opposing end of the plate shaped permanent magnet;
   a frame shaped permanent having a first permeable pole piece aligned with the one end of the plate shaped permanent magnet and a second permeable pole piece aligned with the opposing end of the plate shaped permanent magnet, such that the first and second permeable pole pieces provide a second external magnetic field having a direction parallel to and in the same direction as that generated by the first external magnetic field such that the first and second external magnetic fields combine to provide a uniform external magnetic field in a parallel plane disposed between the plate and frame shaped magnets, the substantially uniform external magnetic field having an area within the frame shaped magnet and a surface of the plate shaped magnet proximate the frame shaped magnet.

8. The combination of permanent magnets of claim 7, wherein the first and second permeable pole pieces are disposed in a plane parallel to the plate shaped permanent magnet.

* * * * *